United States Patent [19]

Nakamura

[11] Patent Number: 5,161,071
[45] Date of Patent: Nov. 3, 1992

[54] READING CIRCUIT USED FOR FLOPPY DISK UNIT

[75] Inventor: Akira Nakamura, Kyoto, Japan

[73] Assignee: Rohm Co., Ltd., Kyoto, Japan

[21] Appl. No.: 557,017

[22] Filed: Jul. 25, 1990

[30] Foreign Application Priority Data

Aug. 3, 1989 [JP] Japan .................... 1-202563

[51] Int. Cl.$^5$ .................................. G11B 5/09
[52] U.S. Cl. .......................... 360/46; 360/67
[58] Field of Search ............ 360/46, 67; 369/59, 369/60; 371/6; 307/350

[56] References Cited

U.S. PATENT DOCUMENTS

| | | | |
|---|---|---|---|
| 3,906,379 | 9/1975 | Tuhro | 307/350 X |
| 4,564,870 | 1/1986 | Kitamura | 360/46 X |
| 4,686,586 | 8/1987 | Dutcher | 360/46 |
| 4,751,591 | 6/1988 | Fujimoto | 360/46 |

*Primary Examiner*—Aristotelis Psitos
*Assistant Examiner*—Joseph P. Kraynak, Jr.
*Attorney, Agent, or Firm*—Oliff & Berridge

[57] ABSTRACT

A reading circuit used for a floppy disk unit capable of reading data by converting data stored upon the surface of a floppy disk in the form of magnetic variations of a residual magnetism into voltage variations by using a magnetic head. While one of the voltage signals read by a magnetic head is differentiated by a differentiating circuit with a predetermined differential property, the other voltage signal is supplied to a level slicer and is output after being converted into rectangular pulses at a predetermined threshold value. The pulse signals are delayed in accordance with a phase shift period caused by a differential of a differentiating circuit. The delayed signals are then delivered to a comparator, which detects a signal output from the differentiating circuit by performing a comparison, so as to activate the comparator intermittently. The pulse signals, a peak value of which is detected by the comparator, are shaped by a pulse shaping circuit, and are output.

7 Claims, 4 Drawing Sheets

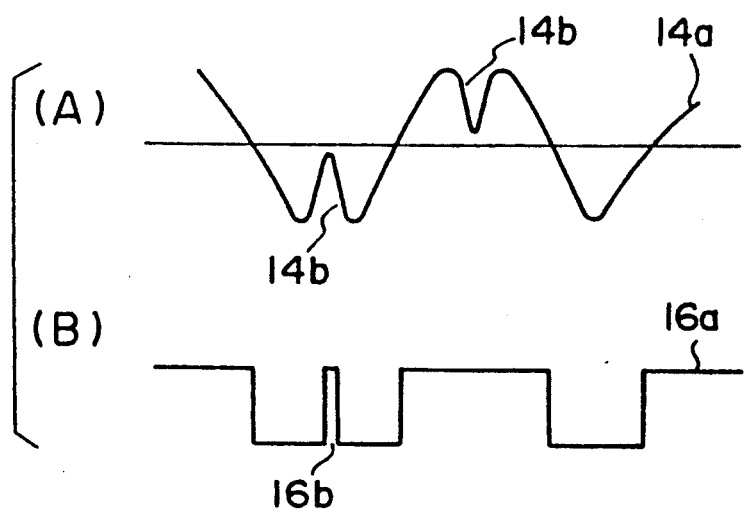

READING CIRCUIT USED FOR FLOPPY DISK UNIT

DETAILED DESCRIPTION OF THE INVENTION

1. Field of the Invention

This invention relates to a reading circuit used for a floppy disk unit, and more particularly to a reading circuit used for a floppy disk unit capable of reading data by a level slicing method.

2. Description of the Related Art

A floppy disk made of a polyester disk, upon the surface of which magnetic particles are applied, is widely used in the field of an auxiliary memory employed in computers or word processors as a memory which has a large storage capacity and is reloadable. Data are stored on the surface of the disk in the form of magnetic variations of a residual magnetism, and are read by a magnetic head by converting the magnetic variations into voltage variations.

FIG. 4 of the accompanying drawings shows a schematic block diagram of an existing reading circuit used for a floppy disk unit. Magnetic variations recorded on the surface of a floppy disk (not-illustrated) are converted into voltage variations by a magnetic head 10, and these magnetic variations are then amplified by an amplifier 11. A peak of the read-out voltage signal is detected by a low pass filter 12, a differentiating circuit 14, and a zero volt comparator 16, and thus detected signal is then output as a read-out data 18a after it is shaped by a pulse shaping circuit 18.

FIG. 5 illustrates a timing chart of the same existing reading circuit. As illustrated in FIG. 5A, data are recorded in the form of the residual magnetism, which causes a transition, on the surface of a floppy disk 20. When these data are read by means of the magnetic head 10 through the low pass filter 12, a voltage waveform 12a shown in FIG. 5B is obtained. Since a region at which the residual magnetism causes transition is where the maximum magnetic flux variations occur, a peak output which appears in the voltage waveform 12a therefore corresponds to that region. A waveform 14a shown in FIG. 5C is what the read-out voltage waveform 12a is differentiated by the differentiating circuit 14. When a portion of the waveform 14a which exceeds zero volt is further sliced by the zero volt comparator 16, the waveform 16a shown in FIG. 5D is obtained. Moreover, when this voltage waveform 16a is input to the pulse shaping circuit 18 as a trigger pulse and is shaped to the pulses having a predetermined pulse width, the pulse waveform 18a shown in FIG. 5E appears, whereby magnetic data shown in FIG. 5A are read out.

However, the aforementioned conventional reading circuit used for a floppy disk unit has several drawbacks. FIGS. 6A and 6B illustrate a partially enlarged timing chart. As shown in FIG. 6A, there occurs a concave, or a so-called saddle, at a peak portion of the differentiated voltage waveform 14a. This saddle occurs because the read-out voltage has no variations in this region, shown in FIG. 5A, at which the magnitude of the magnetism is constant. In case the magnitude of the residual magnetism is large or the magnetic head has a low resolution, an output 16a produced from the zero volt comparator 16 is free from any influence due to the saddle. However, when the resolution of the magnetic head is improved as highly as shown in FIGS. 6A and 6B, the saddle portion reaches as far as the zero volt level, thereby causing a read error 16b when reading the output 16a produced by the zero volt comparator 16.as shown in FIG. 6B.

As a conventional countermeasure to eliminate the saddle 14b, there is provided a time domain filter between the differentiating circuit 14 and the zero volt comparator 16, so that the cessation of the comparator can be realized for a predetermined period, as if it is masked, to remove the saddle 14b. This countermeasure, however, is ineffective when the width of the saddle is broader than that of the masking period because the masking is liable to the noise and the masking period has a limitation.

SUMMARY OF THE INVENTION

This invention is to solve the above-described problems, and an object of the invention is to eliminate an read error due to a saddle which occurs in a differentiated voltage waveform and to provide a reading circuit, used for a floppy disk unit, capable of reading data properly.

To this end, a reading circuit according to this invention comprises a magnetic head capable of reading data, stored in the form of magnetic variations upon the surface of a floppy disk, as in the form of voltage variations; a differentiating circuit for differentiating a voltage signal read by the magnetic head with a predetermined differential property; a level slicer, connected in parallel with the differentiating circuit, for producing pulses when the voltage signal read by the magnetic head exceeds a predetermined threshold level; a delay circuit for delaying pulses output from the level slicer in accordance with a phase shift period caused by a differential of the differentiating circuit; a comparator for intermittently detecting the zero level of a voltage signal differentiated by the differentiating circuit by using delayed pulses output from the delay circuit; and a shaping circuit for shaping pulses output from the comparator, thereby reading data stored upon the floppy disk.

According to this invention, one of the voltage signal read by the magnetic reading head is differentiated by a differentiating circuit with a predetermined differential property, whereas the other signal is delivered to the level slicer and is output after being converted into rectangular pulses with a predetermined threshold value. Thereafter, these pulse signals are delayed for a period equivalent to a phase shift period caused by a differential of the differentiating circuit. These delayed pulses are then transferred to the comparator for detecting an output signal delivered from the differentiating circuit by conducting a comparison of the input signal so that the comparator can operate intermittently. The pulse signals, a peak output of which is detected by the comparator, are shaped at the pulse shaping circuit, and are output. Thus, since the comparator operates only for a period in which a saddle occurs by utilizing delayed rectangular pulses, it is possible to prevent read errors due to the saddle.

Specifically, according to the reading circuit used for the floppy disk unit, a voltage signal read by the magnetic head is input to the level slicer. The level slicer produces rectangular pulses and delivers these pulses to the delay circuit only when an input signal exceeds a predetermined threshold value, e.x., when the input signal attains not less than 30% to 40% of the peak voltage.

Although the delay circuit produces delayed rectangular pulses as an output by making the delivered rectangular pulses delayed, the delay period of the circuit is determined by the differential property of the differentiating circuit. That is, the rectangular pulses are delayed in accordance with the phase shift period of the differentiated signal output from the differentiating circuit. Theses delayed pulses are used as a mask for the zero volt comparator.

Thus, by employing the level slicer, which is employed for enabling the zero volt comparator to be intermittently operated in accordance with the voltage value of the input signal, and by delaying a masking period so as to correspond to the phase shift period even if a differentiated signal delivered from the differentiating circuit has a phase shift period, it becomes possible to grantee a proper data reading with a masking range, for eliminating an influence due to the saddle, set at the optimum width.

Other objects and advantages of the present invention will be apparent to those skilled in the art from the following description with reference to the appended drawings wherein like numerals denote like parts.

BRIEF DESCRIPTION OF THE ACCOMPANYING DRAWINGS

FIGS. 5 and 6 are timing charts of the conventional reading circuit.

PREFERRED EMBODIMENTS OF THE INVENTION

One preferred embodiment of a reading circuit used for a floppy disk unit in accordance with this invention is now explained with reference to the accompanying drawings.

Figure 1:
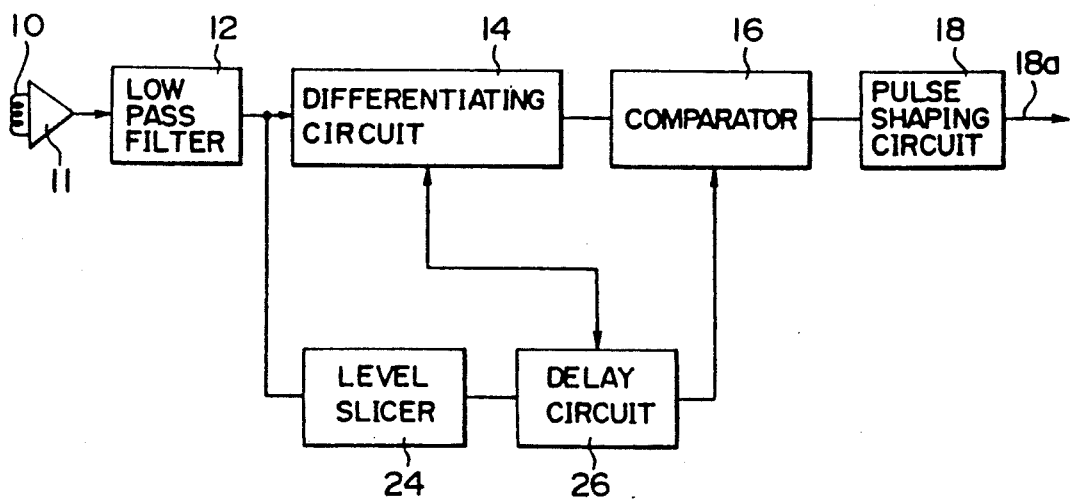
FIG. 1 is a block diagram illustrating a structure of a reading circuit used for a floppy disk unit in accordance with one embodiment of the present invention.

FIG. 1 is a block diagram illustrating a structure of a reading circuit in accordance with one embodiment of the present invention. In FIG. 1, magnetic variations recorded on the surface of a floppy disk (not illustrated) are converted into voltage variations, and then the voltage variations are amplified by an amplifier 11. Thereafter, a high frequency noise of an amplified voltage signal is removed by a low pass filter 12, and is input to a differentiating circuit 14.

The differentiating circuit 14 performs a differential of the input voltage signal with a predetermined differential property. In general, the differential property of the differentiating circuit is determined by a resistance value of a variable resistor disposed at the outside of the differentiating circuit, which is packaged in the form of an IC, and is featured by that the more an input signal shifts towards a high frequency, the more a phase shifts away from a desired differentiated waveform. As is apparent from the following measured values, when an input signal has a value in a differential region, a phase shift, or a phase shift period which is obtained by converting the magnitude of the phase shift into a time, is not largely dependent on a frequency of the input signal but is reversely proportion to a preset frequency (obtained when an output value drops by 3 dB) which is determined by the resistor externally disposed.

f=125 kHz (2HD and 2DD types)

$f_0 = 1.2$ MHz, $\theta = 529$ ns $f_0 = 1.8$ MHz, $\theta = 353$ ns $f_0 = 2.4$ MHz, $\theta = 265$ ns f=300 kHz (some of 2HD types)

$f_0 = 1.2$ MHz, $\theta = 520$ ns $f_0 = 1.8$ MHz, $\theta = 350$ ns $f_0 = 2.4$ MHz, $\theta = 264$ ns f=62.5 kHz (2DD type)

$f_0 = 600$ kHz, $\theta = 1057$ ns $f_0 = 900$ kHz, $\theta = 706$ ns $f_0 = 1.2$ MHz, $\theta = 530$ ns f=150 kHz (some of 2HD types)

$f_0 = 600$ kHz, $\theta = 1040$ ns $f_0 = 900$ kHz, $\theta = 700$ ns $f_0 = 1.2$ MHz, $\theta = 528$ ns, where f depicts an input signal frequency, $f_0$; a preset frequency of a differentiating circuit, $\theta$; a phase shift period.

Thus, the differentiating circuit 14 does not produce an output of a signal, which is obtained by perfectly differentiating the input signal, but a signal having a phase shift.

The signal output from the differentiating circuit 14 is input to the zero volt comparator 16 for detecting a zero volt of an input signal, and the signal output from the zero volt comparator is further transferred to the pulse shaping circuit 18.

Meanwhile, the voltage signal delivered from the low pass filter 12 is not only input to the differentiating circuit 14 but also to the level slicer 24. This level slicer 24 is made up of a semiconductor IC circuit for generating rectangular pulses when an input signal exceeds a predetermined threshold value, e.x., when the input signal attains 30% to 40% of the peak voltage or more.

The rectangular pulses produced at the level slicer 24 are then input to the delay circuit 26. This delay circuit produces an output signal from the input rectangular pulses with a delay in accordance with a phase shift period of the above-mentioned differentiating circuit 14.

Figure 3:
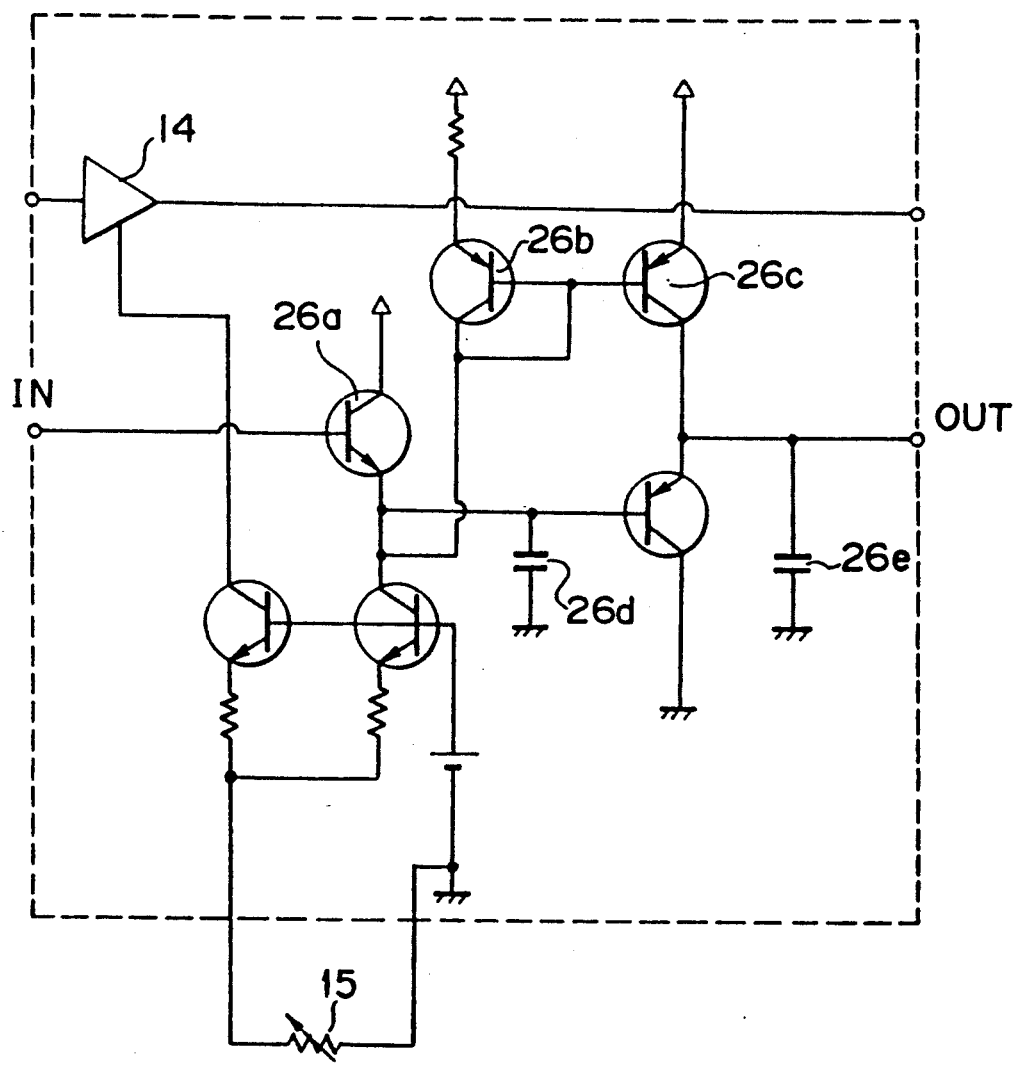
FIG. 3 is a circuit diagram of a delay circuit in accordance with the same embodiment of the present invention.
Figure 4:
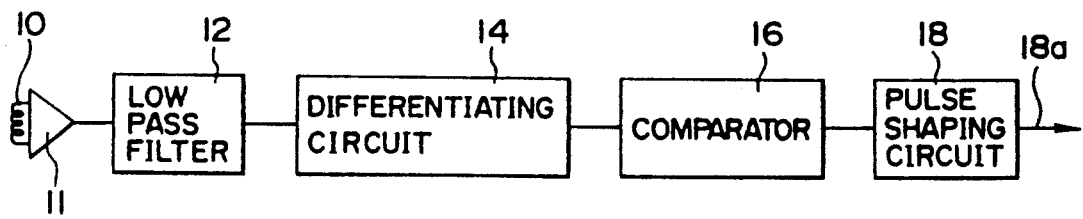
FIG. 4 is a block diagram illustrating a structure of a conventional reading circuit used for a floppy disk unit.

FIG. 3 illustrates a circuit diagram of the differentiating circuit 14, the resistor 15 externally disposed for determining the differential property of the differentiating circuit 14, and the delay circuit 26. The delay circuit 26 comprises an emitter follower type N-P-N transistor 26a, and the input/output transistors 26b, 26c which constitute a current mirror, wherein the emitter of the transistor 26a is connected to a delay capacitor 26d one end of which is grounded, whereas the collector of the output transistor is connected to a delay capacitor 26e one end of which is grounded.

Figure 2:
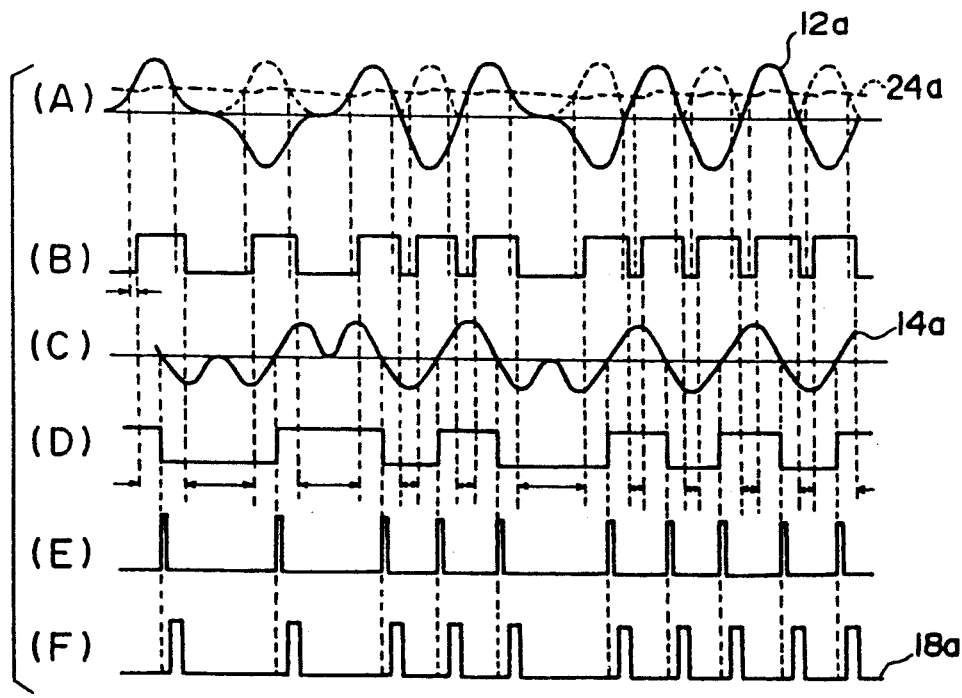
FIG. 2 is a timing flow chart in accordance with the same embodiment of the present invention.

The reading circuit used for a floppy disk unit, according to one embodiment of the present invention, has a structure as described above, and an operation of the circuit will be explained hereinbelow with reference to a timing chart of FIG. 2.

Figure 5:
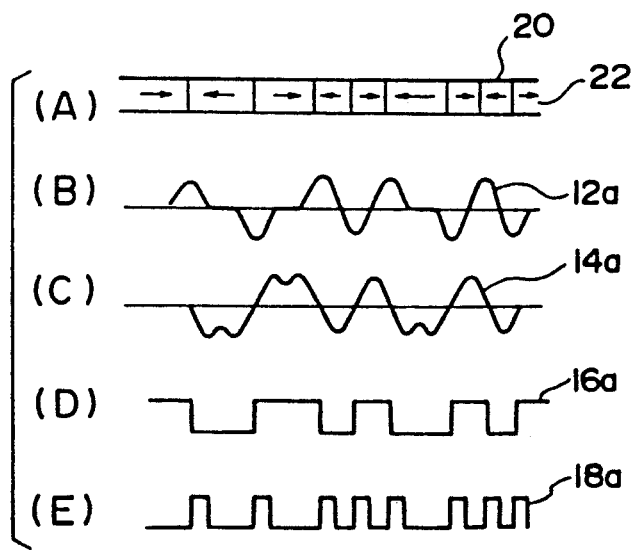

FIG. 2A illustrates a voltage signal read and amplified by the magnetic head 10 the same as shown in FIG. 5A. A wave signal shown in FIG. 2c is that the voltage signal 12a input to the differentiating circuit 14 is differentiated with a predetermined phase shift.

Meanwhile, the voltage signal 12a is also input to the level slicer 24, and the voltage signal, which is rectified by a full-wave rectifier, is detected at a predetermined threshold value 24a, as drawn with a broken line in FIG. 2A, to produce rectangular pulses.

Further, these rectangular pulses are input to the delay circuit 26, and are delayed. That is, in FIG. 3, when the rectangular pulses 26 flow to an input terminal "IN" of the delay circuit 26, these pulse signals control the on/off operation of the emitter follower transistor 26a, so that the delay capacitor 26d is charged/discharged. Here, in the case of the charging of the delay capacitor 26d, the capacitor is momentarily charged because the transistor 26d is a low output impedance emitter follower type. On the other hand, in the case of the discharging of the delay capacitor 26d, the capacitor discharges in accordance with a time constant determined by the capacitance thereof and a resistance value of the resistor 15 externally disposed.

Thereby, the discharging period of the delay capacitor 26d is determined in accordance with the preset value of the resistor 15 disposed at the outside of the differentiating circuit 14, whereby the discharging period of the delay capacitor 26d is automatically determined in accordance with the phase shift period of the differentiating circuit 14.

Likewise, since the emitter of the input transistor 26b which constitutes the current mirror in FIG. 3 is connected to the resistor 15 externally disposed, when the delay capacitor 26e is charged by the output transistor 26c, the capacitor 26e is charged in accordance with a time constant determined by the capacitance thereof and the resistance value of the resistor 15 externally disposed.

Accordingly, the charging period is determined in accordance with the preset value of the resistor 15 externally disposed, whereby the charging period of the delay capacitor 26e is automatically determined in accordance with the phase shift period of the differentiating circuit 14 in the same manner as the case of discharging.

As mentioned above, the charging/discharging periods of the delay capacitors 26d, 26e vary in accordance with the resistance value of the resistor 15 externally disposed for determining the differential property of the differentiating circuit 14, whereby the rectangular pulses delivered from the level slicer 24 are delayed in accordance with the differential property of the differentiating circuit 14, or the phase shift period of the differentiating circuit 14, and then the delayed pulses are output from an output terminal "OUT" of the delay circuit. FIG. 2B illustrates the pulses thus delayed by the delay circuit 26.

These delayed pulses are further delivered to the zero volt comparator 16 and are used as the mask for the zero volt comparator 16. Specifically, the zero volt comparator 16 is set to operate to conduct a comparison of the differentiated signal output from the differentiating circuit 14 only while these pulses are being input, and to be suspended not to perform the comparison of the signal during the other periods (the areas indicated by arrows in FIG. 2). Consequently, even though the saddles occur in the differentiated signal as shown in FIG. 2D, the output from the zero volt comparator 16 is free from the influence due to this saddle, and it becomes possible to read the data properly by shaping the pulses after detecting the edges of the pulses output as shown in FIGS. 2E and 2F.

As has been described in the foregoing, by adopting the level slice method for the reading circuit of the floppy disk apparatus according to the present invention and by delaying the pulse signals obtained by the level slicer in accordance with the phase shift of the differentiating circuit, the masking period of the zero volt comparator is automatically set to the optimum, thereby eliminating read errors and making it possible to read data without being dependent on a frequency of the input signal.

As mentioned above, according to this invention, it is possible to realize the correct data reading with reading errors due to the saddles which occur in the differentiated voltage waveforms eliminated, and also it becomes possible to easily satisfy the specification of the error rate of $10^{-12}$ or less required for the floppy disk unit.

What is claimed is:

1. A reading circuit used for a floppy disk unit capable of reading data by converting data stored upon a surface of a floppy disk in the form of magnetic variations of a residual magnetism into voltage variations by using a magnetic head, said reading circuit comprising:

(a) a magnetic head capable of reading data recorded in the form of magnetic variations upon the surface of a floppy disk as in the form of voltage variations;

(b) a differentiating circuit for providing a differentiated voltage signal read by said magnetic head with a predetermined differential property, said predetermined differential property being a phase shift of the differentiated voltage signal;

(c) a level slicer, connected in parallel with said differentiating circuit, for producing pulses when the differentiated voltage signal read by said magnetic head exceeds a predetermined threshold level;

(d) a delay circuit for delaying pulses output from said level slicer by the phase shift period of the differentiated voltage signal;

(e) a comparator for detecting a zero level of the differentiated voltage signal only when the delayed pulses from said delay circuit are being input into said comparator; and (f) a shaping circuit for shaping pulses output from said comparator.

2. A reading circuit according to claim 1, wherein a resistor, for setting the phase shift period to a predetermined value, is disposed at the outside of said differentiating circuit.

3. A reading circuit according to claim 1, wherein said level slicer, comprises semiconductor IC circuits for generating rectangular pulses only when a voltage of an input signal exceeds 30% to 40% of a peak voltage.

4. A reading circuit according to claim 2, wherein said delay circuit further comprises an N-P-N type emitter follower transistor, an emitter of said transistor being connected to a first delay capacitor whose one end is grounded, and being connected to a current mirror consisting of a first P-N-P type transistor and a second P-N-P type transistor, said second P-N-P type transistor having a collector which is connected to a second delay capacitor, one end of which is grounded, wherein activation of the N-P-N type emitter follower transistor by the pulses from said level slicer causes the first delay capacitor to charge, and activation of the second P-N-P type transistor causes the second delay capacitor to charge.

5. A reading circuit according to claim 4, wherein a delay period of said delay circuit is determined by a time constant determined by said resistor externally disposed and said first and second delay capacitors.

6. A reading circuit used for a floppy disk unit capable of reading data by converting data stored upon the surface of a floppy disk in the form of magnetic variations of a residual magnetism into voltage variations by using a magnetic head, said reading circuit comprising:
 (a) a magnetic head capable of reading data recorded in the form of magnetic variations upon the surface of a floppy disk as in the form of voltage variations;
 (b) a differentiating circuit for providing a differentiated voltage signal read by said magnetic head with a predetermined differential property, said predetermined differential property being a phase shift of the differentiated voltage signal;
 (c) a level slicer, connected in parallel with said differentiating circuit and composed of semiconductor IC circuits, for producing rectangular pulses when the differentiated voltage signal read by said magnetic head exceeds 30% to 40% of a peak voltage value;
 (d) a delay circuit having a resistor for setting a time constant in order to delay pulses output from said level slicer by the phase shift period of the differentiated voltage signal;
 (e) a comparator for detecting a zero level of the differentiated voltage signal only when the delayed pulses from said delay circuit are being input into said comparator; and
 (f) a shaping circuit for shaping pulses output from said comparator.

7. A reading circuit according to claim 6, wherein said delay circuit further comprises an N-P-N type emitter follower transistor, an emitter of said transistor being connected to a first delay capacitor whose one end is grounded, and being connected to a current mirror consisting of a first P-N-P type transistor and a second P-N-P type transistor, said second P-N-P transistor having a collector which is connected to a second delay capacitor, one end of which is grounded, wherein activation of the N-P-N type emitter follower transistor by the pulses from said level slicer causes the first delay capacitor to charge, and activation of the second P-N-P type transistor causes the second delay capacitor to charge.

* * * * *